(12) United States Patent
Wu et al.

(10) Patent No.: US 7,763,927 B2
(45) Date of Patent: Jul. 27, 2010

(54) NON-VOLATILE MEMORY DEVICE HAVING A NITRIDE-OXIDE DIELECTRIC LAYER

(75) Inventors: Chao-I Wu, Zhubei (TW); Tzu-Hsuan Hsu, Jhongpu Township, Chiayi County (TW); Hang-Ting Lue, Hsinchu (TW); Erh-Kun Lai, Taichung County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/300,813

(22) Filed: Dec. 15, 2005

(65) Prior Publication Data

US 2007/0138539 A1   Jun. 21, 2007

(51) Int. Cl.
*H01L 29/792* (2006.01)
(52) U.S. Cl. .................. 257/314; 257/324; 257/325; 257/E29.304; 257/E29.309
(58) Field of Classification Search .............. 257/314, 257/324, 325, 390, E27.102, E27.103, E29.304, 257/E29.309, E29.316, E21.18, E21.21, E21.423, 257/E21.679
See application file for complete search history.

(56) References Cited

U.S. PATENT DOCUMENTS

| | | |
|---|---|---|
| 4,173,766 A | 11/1979 | Hayes |
| 4,630,086 A | 12/1986 | Sato et al. |
| 4,959,812 A | 9/1990 | Momodomi et al. |
| 5,270,969 A | 12/1993 | Iwahashi et al. |
| 5,278,439 A | 1/1994 | Ma et al. |
| 5,286,994 A | 2/1994 | Ozawa et al. |
| 5,319,229 A | 6/1994 | Shimoji et al. |
| 5,355,464 A | 10/1994 | Fandrich et al. |
| 5,408,115 A | 4/1995 | Chang |
| 5,412,603 A | 5/1995 | Schreck et al. |
| 5,424,569 A | 6/1995 | Prall |
| 5,448,517 A | 9/1995 | Iwahashi et al. |
| 5,483,486 A | 1/1996 | Javanifard et al. |
| 5,485,422 A | 1/1996 | Bauer et al. |
| 5,509,134 A | 4/1996 | Fandrich et al. |

(Continued)

FOREIGN PATENT DOCUMENTS

CN   1423338   6/2003

(Continued)

OTHER PUBLICATIONS

F. Ito et al. "A Novel MNOS Technology Using Gate Hole Injection in Erase Operations for Embedded Nonvolatile Memory Applications," 2004 Symposium on VLSI Technology Digest of Technical Papers, Jul. 2004, pp. 80-81.

(Continued)

*Primary Examiner*—Sue Purvis
*Assistant Examiner*—Leslie Pilar Cruz
(74) *Attorney, Agent, or Firm*—Kenta Suzue; Haynes Beffel & Wolfeld LLP

(57) ABSTRACT

A non-volatile memory cell may include a semiconductor substrate; a source region in a portion of the substrate; a drain region within a portion of the substrate; a well region within a portion of the substrate. The memory cell may further include a first carrier tunneling layer over the substrate; a charge storage layer over the first carrier tunneling layer; a second carrier tunneling layer over the charge storage layer; and a conductive control gate over the second carrier tunneling layer. Specifically, the drain region is spaced apart from the source region, and the well region may surround at least a portion of the source and drain regions. In one example, the second carrier tunneling layer provides hole tunneling during an erasing operation and may include at least one dielectric layer.

18 Claims, 7 Drawing Sheets

U.S. PATENT DOCUMENTS

| | | |
|---|---|---|
| 5,515,324 A | 5/1996 | Tanaka et al. |
| 5,566,120 A | 10/1996 | D'Souza |
| 5,602,775 A | 2/1997 | Vo |
| 5,644,533 A | 7/1997 | Lancaster et al. |
| 5,694,356 A | 12/1997 | Wong et al. |
| 5,745,410 A | 4/1998 | Yiu et al. |
| 5,753,950 A | 5/1998 | Kojima et al. |
| 5,768,192 A | 6/1998 | Eitan et al. |
| RE35,838 E | 7/1998 | Momodomi et al. |
| 5,877,054 A | 3/1999 | Yamauchi et al. |
| 5,895,949 A | 4/1999 | Endoh et al. |
| 5,952,692 A | 9/1999 | Nakazato et al. |
| 5,966,603 A | 10/1999 | Eitan et al. |
| 6,011,725 A | 1/2000 | Eitan |
| 6,026,026 A | 2/2000 | Chan et al. |
| 6,034,896 A | 3/2000 | Ranaweera et al. |
| 6,074,917 A | 6/2000 | Chang et al. |
| 6,096,603 A | 8/2000 | Chang et al. |
| 6,151,248 A | 11/2000 | Harari et al. |
| 6,169,693 B1 | 1/2001 | Chan et al. |
| 6,172,907 B1 | 1/2001 | Jenne |
| 6,194,272 B1 | 2/2001 | Sung et al. |
| 6,215,148 B1 | 4/2001 | Eitan et al. |
| 6,218,700 B1 | 4/2001 | Papadas |
| 6,219,276 B1 | 4/2001 | Parker |
| 6,297,096 B1 | 10/2001 | Boaz et al. |
| 6,320,786 B1 | 11/2001 | Chang et al. |
| 6,356,478 B1 | 3/2002 | McCollum |
| 6,363,013 B1 | 3/2002 | Lu et al. |
| 6,396,741 B1 | 5/2002 | Bloom et al. |
| 6,436,768 B1 | 8/2002 | Yang et al. |
| 6,458,642 B1 | 10/2002 | Yeh et al. |
| 6,487,114 B2 | 11/2002 | Jong et al. |
| 6,512,696 B1 | 1/2003 | Fan et al. |
| 6,522,585 B2 | 2/2003 | Pasternak |
| 6,538,923 B1 | 3/2003 | Parker |
| 6,552,386 B1 | 4/2003 | Wu et al. |
| 6,566,699 B2 | 5/2003 | Eitan et al. |
| 6,587,903 B2 | 7/2003 | Roohparvar |
| 6,614,070 B1 | 9/2003 | Hirose et al. |
| 6,614,694 B1 | 9/2003 | Yeh et al. |
| 6,643,181 B2 | 11/2003 | Sofer et al. |
| 6,643,185 B1 | 11/2003 | Wang et al. |
| 6,645,813 B1 | 11/2003 | Hsieh et al. |
| 6,646,924 B1 | 11/2003 | Tsai et al. |
| 6,657,894 B2 | 12/2003 | Yeh et al. |
| 6,670,240 B2 | 12/2003 | Ogura et al. |
| 6,670,671 B2 | 12/2003 | Sasago et al. |
| 6,674,138 B1 | 1/2004 | Halliyal et al. |
| 6,677,200 B2 | 1/2004 | Lee et al. |
| 6,690,601 B2 | 2/2004 | Yeh et al. |
| 6,709,928 B1 | 3/2004 | Jenne et al. |
| 6,714,457 B1 | 3/2004 | Hsu et al. |
| 6,720,630 B2 | 4/2004 | Mandelman et al. |
| 6,744,105 B1 | 6/2004 | Chen et al. |
| 6,784,480 B2 | 8/2004 | Bhattacharyya |
| 6,795,357 B1 | 9/2004 | Liu et al. |
| 6,798,012 B1 | 9/2004 | Ma et al. |
| 6,815,805 B2 | 11/2004 | Weimer |
| 6,818,558 B1 | 11/2004 | Rathor et al. |
| 6,829,175 B2 | 12/2004 | Tsai et al. |
| 6,856,551 B2 | 2/2005 | Mokhlesi et al. |
| 6,858,906 B2 | 2/2005 | Lee et al. |
| 6,885,044 B2 | 4/2005 | Ding |
| 6,897,533 B1 | 5/2005 | Yang et al. |
| 6,912,163 B2 | 6/2005 | Zheng et al. |
| 6,933,555 B2 | 8/2005 | Hsieh et al. |
| 6,937,511 B2 | 8/2005 | Hsu et al. |
| 6,942,320 B2 | 9/2005 | Chung et al. |
| 6,970,383 B1 | 11/2005 | Han et al. |
| 6,977,201 B2 | 12/2005 | Jung et al. |
| 6,995,424 B2 | 2/2006 | Lee et al. |
| 6,996,011 B2 | 2/2006 | Yeh et al. |
| 7,005,366 B2 | 2/2006 | Chau et al. |
| 7,012,297 B2 | 3/2006 | Bhattacharyya |
| 7,018,895 B2 | 3/2006 | Ding |
| 7,026,682 B2 | 4/2006 | Chung et al. |
| 7,071,061 B1 | 7/2006 | Pittikoun et al. |
| 7,075,828 B2 | 7/2006 | Lue et al. |
| 7,106,625 B2 | 9/2006 | Yeh et al. |
| 7,115,469 B1 * | 10/2006 | Halliyal et al. ............ 438/257 |
| 7,115,942 B2 | 10/2006 | Wang |
| 7,120,059 B2 | 10/2006 | Yeh et al. |
| 7,133,313 B2 | 11/2006 | Shih et al. |
| 7,151,692 B2 | 12/2006 | Wu et al. |
| 7,154,143 B2 | 12/2006 | Jung et al. |
| 7,158,420 B2 | 1/2007 | Lung |
| 7,164,603 B2 | 1/2007 | Shih et al. |
| 7,166,513 B2 | 1/2007 | Hsu et al. |
| 7,187,590 B2 | 3/2007 | Zous et al. |
| 7,190,614 B2 | 3/2007 | Wu |
| 7,209,386 B2 | 4/2007 | Yeh et al. |
| 7,209,390 B2 | 4/2007 | Lue et al. |
| 7,279,740 B2 | 10/2007 | Bhattacharyya et al. |
| 7,473,589 B2 | 1/2009 | Lai et al. |
| 2001/0012663 A1 | 8/2001 | Magri' et al. |
| 2002/0167844 A1 | 11/2002 | Han et al. |
| 2002/0179958 A1 | 12/2002 | Kim |
| 2003/0025147 A1 | 2/2003 | Nomoto et al. |
| 2003/0030100 A1 | 2/2003 | Lee et al. |
| 2003/0032242 A1 * | 2/2003 | Lee et al. ................ 438/257 |
| 2003/0036250 A1 | 2/2003 | Lin et al. |
| 2003/0042534 A1 | 3/2003 | Bhattacharyya |
| 2003/0047755 A1 | 3/2003 | Lee et al. |
| 2003/0067032 A1 | 4/2003 | Caprara et al. |
| 2003/0089935 A1 | 5/2003 | Fan et al. |
| 2003/0146465 A1 | 8/2003 | Wu |
| 2003/0185055 A1 | 10/2003 | Yeh et al. |
| 2003/0224564 A1 | 12/2003 | Kang et al. |
| 2004/0079983 A1 | 4/2004 | Chae et al. |
| 2004/0084714 A1 | 5/2004 | Ishii et al. |
| 2004/0125629 A1 | 7/2004 | Scheuerlein et al. |
| 2004/0145024 A1 | 7/2004 | Chen et al. |
| 2004/0183126 A1 | 9/2004 | Bae et al. |
| 2004/0256679 A1 | 12/2004 | Hu |
| 2005/0001258 A1 | 1/2005 | Forbes |
| 2005/0006696 A1 * | 1/2005 | Noguchi et al. ............ 257/316 |
| 2005/0023603 A1 | 2/2005 | Eldridge et al. |
| 2005/0062091 A1 | 3/2005 | Ding |
| 2005/0074937 A1 | 4/2005 | Jung |
| 2005/0093054 A1 | 5/2005 | Jung |
| 2005/0218522 A1 | 10/2005 | Nomoto et al. |
| 2005/0219906 A1 | 10/2005 | Wu |
| 2005/0237801 A1 | 10/2005 | Shih |
| 2005/0237809 A1 | 10/2005 | Shih et al. |
| 2005/0237813 A1 | 10/2005 | Zous et al. |
| 2005/0237815 A1 | 10/2005 | Lue et al. |
| 2005/0237816 A1 | 10/2005 | Lue et al. |
| 2005/0255652 A1 | 11/2005 | Nomoto et al. |
| 2005/0270849 A1 | 12/2005 | Lue |
| 2005/0281085 A1 | 12/2005 | Wu |
| 2006/0007732 A1 | 1/2006 | Yeh |
| 2006/0044872 A1 | 3/2006 | Nazarian |
| 2006/0088983 A1 | 4/2006 | Fujisawa et al. |
| 2006/0197145 A1 | 9/2006 | Pittikoun et al. |
| 2006/0198189 A1 | 9/2006 | Lue et al. |
| 2006/0198190 A1 | 9/2006 | Lue |
| 2006/0202252 A1 | 9/2006 | Wang et al. |
| 2006/0202256 A1 | 9/2006 | Harari |
| 2006/0202261 A1 | 9/2006 | Lue et al. |
| 2006/0234446 A1 | 10/2006 | Wei et al. |
| 2006/0258090 A1 * | 11/2006 | Bhattacharyya et al. ..... 438/257 |
| 2006/0261401 A1 | 11/2006 | Bhattacharyya |
| 2006/0275986 A1 | 12/2006 | Kobayashi et al. |

| | | |
|---|---|---|
| 2006/0281260 A1 | 12/2006 | Lue |
| 2007/0012988 A1 | 1/2007 | Bhattacharyya |
| 2007/0029625 A1* | 2/2007 | Lue et al. .................... 257/411 |
| 2007/0031999 A1 | 2/2007 | Ho et al. |
| 2007/0032018 A1 | 2/2007 | Tuntasood et al. |
| 2007/0045718 A1* | 3/2007 | Bhattacharyya ............. 257/324 |
| 2007/0069283 A1 | 3/2007 | Shih et al. |
| 2007/0138539 A1 | 6/2007 | Wu et al. |

FOREIGN PATENT DOCUMENTS

| | | |
|---|---|---|
| EP | 0 016 246 | 10/1980 |
| EP | 1411555 | 11/2006 |
| JP | 09162313 | 6/1997 |
| JP | 11040682 | 2/1999 |
| JP | 11233653 | 8/1999 |
| JP | 2004 363329 | 12/2004 |
| WO | WO-9428551 | 12/1994 |

OTHER PUBLICATIONS

D.J. DiMaria et al. "Conduction Studies in Silicon Nitride: Dark Currents and Photocurrents," IBM J. Res. Develop., May 1977, pp. 227-244.

C.C. Yeh et al. "PHINES: A Novel Low Power Program/Erase, Small Pitch, 2-Bit per Cell Flash Memory," IEDM Tech. Dig., 2002, pp. 931-934.

Hijiya, S., et al., "High-Speed Write/Erase EAROM Cell with Graded Energy Band-Gap Insulator," Electronics and Communications in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 layers," Surface Science Sep. 20, 2004, vol. 566-568, 1185-1189.

Buckley, J., et al., "Engineering of 'Conduction Band—Created Barriers' or 'Dielectric Constant—Crested Barriers' in view of their application of floating-gate non-volatile memory devices," VLSI 2004, 55:56.

Takata, M., et al., "New Non-Volatile Memory with Extremely High Density Metal Nano-Dots," IEEE IEDM 03-553, 22.5.1-22.5.4.

Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22. 6.4.

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4.

Lee, Chang, et al., "A Novel SONOS Structure of SiO2/SiN/Al2O3 with TaN Metal Gate for Multi-Giga Bit Flash Memeries," IEEE 2003 4 pages.

Cho et al., "Simultaneous Hot-Hole Injection at Drain and Source for Efflcient Erase and Excellent Endurance in SONOS Flash EEPROM Cells," IEEE Electron Device Letters 24(4) 04-2003 260-262.

Lue et al. U.S. Appl. No. 11/756,557 entitled "Cylindrical Channel Charge Trapping Devices With Effectively High Coupling Ratios," filed May 31, 2007.

Lue, U.S. Appl. No. 11/756,559 entitled "Charge Trapping Devices With Field Distribution Layer Over Tunneling Barrier," filed May 31, 2007.

Shih et al., "A Novel 2-bit/cell Nitride Storage Flash Memory with Greater than 1M P/E-cycle Endurance," IEEE IEDM 2004 881-884 (36.3.1-36.3.4).

Blomme et al., "Multilayer tunneling barriers for nonvolatile memory applications," Device Research Conf, 2002 60th DRC Digest 153-154.

Blomme et al., "Write/Erase-Cycling Endurance of Memory Cells with SiO2/HfO2 Tunnel Dielectric," IEEE Trans. on Dev. and Materials Reliability 4(3), Sep. 2004 345-351.

Govoreanu et al., "VARIOT: A Novel Multilayer Tunnel Barrier Concept for Low-Voltage Nonvolatile Memory Devices," IEEE Electron Dev. Lett. 24(2) Feb. 2003 94-101.

Govoreanu et al., "Simulation of Nanofloating Gate Memory with High-k Stacked Dielectrics;" IEEE SISPAD Intl. Conf. Sep. 3-5, 2003 299-302.

Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.

Kim et al., "Robust Multi-Bit Programmable Flash Memory Using a Resonant Tunnel Barrier," Electron Dev. Mtg. Dec. 5-7, 2005, IEDM Technical Digest 861-864.

Likharev, "Layered Tunnel Barriers for Nonvolatile Memory Devices," Appl. Phys. Lett. 73(15) Oct. 1998 2137-2139.

Lue et al., "BE-SONOS: A Bangap Engineered SONOS with Excellent Performance and Reliability," IEDM Tech. Digest Dec. 2005 547-550.

Sung et al, "Multi-Layer SONOS with Direct Tunnel Oxide for High Speed and Long Retention Time," IEEE 2002 Silicon Nanoelectronics Workshop, Jun. 2002, 83-84.

Aminzadeh et al., "Conduction and Charge Trapping in Polysilicon-Silicon Nitride-Oxide-Silicon Structures under Positive Gate Bias," IEEE Trans. on Electron Dev. 35 (4) Apr. 1998, 459-467.

Yamada et al., "A self-convergence erasing scheme for a simple stacked gate flash EEPROM," Proc. of the Int'l Electron Dev. Mtg., IEEE Dec. 1991, 307-310.

Office Action mailed Nov. 23, 2007 in U.S. Appl. No. 11/197,668.

Office Action mailed Oct. 19, 2007 in U.S. Appl. No. 11/324,495.

RCE filed on Feb. 25, 2008 in U.S. Appl. No. 11/831,594.

Office Action mailed Sep. 24, 2007 in U.S. Appl. No. 11/324,540.

Sasago, Y. et al., "90-nm-node multi-level AG-AND type flash memory with cell size of true 2 F/sup 2//bit and programming throughput of 10 MB/s," IEDM, 2003, pp. 823-826.

Fujiwara, I., et al., "0.13 µm MONOS single transistor memory cell with deparated source lines," IEDM 1998, 995-998.

Chang, Kuo-Tung, et al., "A New SONOS Memory Using Source-Side Injection for Programming," IEEE Electron Device Letters, vol. 19, No. 7, Jul. 1998, 253-255.

Kobayashi, T., et al., "A Giga-Scale Assist-Gate (AG)-AND-Type Flash Memory Cell with 20-MB/s Programming Throughput for Content-Downloading Applications," IEDM 2001, 2.2.1-2.2.4.

Naruke, K., et al., "Nonvolatile Semiconductor Memories: Technologies, design and application," C. Hu. Ed., New York, IEEE Press, 1991, Ch. 5, pp. 183-186.

Lahiri, S. K., "MNOS/Floating-Gate Charge Coupled Devices for High Density EEPROMS: A New Concept", Physics of Semiconductor Devices, Dec. 1997, pp. 951-956, vol. 3316, No. 2.

Lee, Jae-Duk, et al., "Effects of Floating-Gate Interference on NAND Flash Memory Cell Operation," IEEE Electron Device Letters, vol. 23, No. 5, May 2002, 264-266.

Shin, Yoocheol, et al., "High Reliable SONOS-type NAND Flash Memory Cell with Al203 for Top Oxide," Non-Volatile Semiconductor Memory Workshop, 2003, 2 pages.

Takata, M, et al. "New Non-Volatile Memory with Extremely High Density Metal Naon-Dots," IEEE IEDM 03-553, 22.5.1-22.5.4.

Baik, Seung, et al., "High Speed adn Nonvolatile Si Nanocrystal Memory for Scaled Flash Technology Using Hlghly Field-Sensitive Tunnel Barrier," IEEE IEDM 03-545, 22.3.1-22.3.4.

White et al., "On the Go with SONOS" IEEE Circuits and Devices, Jul. 2000, 22-31.

Walker, et al., "3D TFT-SONOS Memory Cell for Ultra-High Density File Storage Applications," 2003 Symposium on VLSI Tech Digest of Technical Papers, 29-30.

Minami et al., "New Scaling Guidelines for MNOS Nonvolatile Memory Devices," IEEE Trans on Electron Devices 38(11) Nov. 1991 2519-2526.

Eitan et al., "NROM: A Novel Localized Trapping, 2-Bit Nonvolatile Memory Cell," IEEE Electron Device Lett 21(11) Nov. 2000, 543-545.

Chindalore et al., "A New Combination-Erase Technique for Erasing Nitride Based (SONOS) Nonvolatile Memories," IEEE Electron Dev Lett 24(4) Apr. 2003, 257-259.

Lue et al., "A Novel P-Channel NAND-Type Flash memory with 2-bit/cell Operation and High Programming Throughput (>20 MB/sec)," IEEE 2005, 4 pages.

Sasago, Y. et al., "90-nm-node multi-level AG-AND type flash memory with cell size of true 2 F/sup 2//bit and programming throughput of 10 MB/s," IEDM, 2003, pp. 823-826.

Fujiwara, I., et al., "0.13 μm MONOS single transistor memory cell with deparated source lines," IEDM 1998, 995-998.

Chang, Kuo-Tung, et al., "A New SONOS Memory Using Source-Side Injection for Programming," IEEE Electron Device Letters, vol. 19, No. 7, Jul. 1998, 253-255.

Kobayashi, T., et al., "A Giga-Scale Assist-Gate (AG)-AND-Type Flash Memory Cell with 20-MB/s Programming Throughput for Content-Downloading Applications," IEDM 2001, 2.2.1-2.2.4.

Naruke, K., et al., "Nonvolatile Semiconductor Memories: Technologies, design and application," C. Hu. Ed., New York, IEEE Press, 1991, Ch. 5, pp. 183-186.

Lahiri, S. K., "MNOS/Floating-Gate Charge Coupled Devices for High Density EEPROMS: A New Concept", Physics of Semiconductor Devices, Dec. 1997, pp. 951-956, vol. 3316, No. 2.

Lee, Jae-Duk, et al., "Effects of Floating-Gate Interference on NAND Flash Memory Cell Operation," IEEE Electron Device Letters, vol. 23, No. 5, May 2002, 264-266.

Shin, Yoocheol, et al., "High Reliable SONOS-type NAND Flash Memory Cell with Al2O3 for Top Oxide," Non-Volatile Semiconductor Memory Workshop, 2003, 2 pages.

Takata, M, et al. "New Non-Volatile Memory with Extremely High Density Metal Naon-Dots," IEEE IEDM 03-553, 22.5.1-22.5.4, 2003.

Baik, Seung, et al., "High Speed adn Nonvolatile Si Nanocrystal Memory for Scaled Flash Technology Using Highly Field-Sensitive Tunnel Barrier," IEEE IEDM 03-545, 22.3.1-22.3.4, 2003.

* cited by examiner

NON-VOLATILE MEMORY DEVICE HAVING A NITRIDE-OXIDE DIELECTRIC LAYER

CROSS-REFERENCE TO RELATED APPLICATIONS

This application relates to U.S. patent application Ser. No. 11/197,668, filed on Aug. 4, 2005, entitled "Non-Volatile Memory Semiconductor Device Having an Oxide-Nitride-Oxide (ONO) Top Dielectric Layer."

BACKGROUND OF THE INVENTION

The present invention relates to a non-volatile memory device and a method for manufacturing a non-volatile memory device and, more particularly, to a non-volatile memory semiconductor device having a nitride-oxide dielectric layer and a method for manufacturing a non-volatile memory device having a nitride top dielectric layer.

Non-volatile memory ("NVM") is a semiconductor memory device that is capable of storing the programmed data or information even when electricity supplied to it is removed from a device containing the NVM memory. Examples of NVM include Mask Read-Only Memory (Mask ROM), Programmable Read-Only Memory (PROM), Erasable Programmable Read-Only Memory (EPROM), and Electrically Erasable Programmable Read-Only Memory (EEPROM). Typically, NVM can be programmed with data, read and/or erased, and the programmed data can be stored for an extended period of time before being erased, such as ten years.

An example of an NVM includes Nitride Read Only Memory, which is a type of EEPROM that uses a silicon nitride layer as a charge-trapping layer to store data. Other charge-trapping materials may be used for forming NVM devices. An example of Nitride Read Only Memory cell design includes a metal-oxide-silicon field effect transistor (MOSFET) having an ONO (oxide-nitride-oxide) layer disposed between the gate and the source/drain of the semiconductor material. The nitride layer in the ONO layer is able to "trap" charge (electrons) when the device is "programmed." Charge localization is the ability of the nitride material to store the charge without significant lateral movement of the charge throughout the nitride layer. Nitride Read Only Memory utilizes a relatively thick tunnel oxide layer, which typically negatively impacts the time it takes to erase a memory cell. Nitride Read Only Memory can be contrasted with conventional "floating gate" memory cells wherein the floating gate is conductive and the charge is spread laterally throughout the entire floating gate and charge is transferred through a tunnel oxide layer. Also, Nitride Read Only Memory can be repeatedly programmed, read, erased and/or reprogrammed by known voltage application techniques.

To provide a non-volatile memory device, it is therefore desirable to provide a non-volatile memory semiconductor device that has good charge retention ability or reduced charge loss compared to some of the conventional NVM, such as certain Nitride Read Only Memory devices. It is also desirable to provide an NVM that can be operated with adequate speed, such as that needed when erasing old information or in programming new information.

BRIEF SUMMARY OF THE INVENTION

One example of the present invention comprises a non-volatile memory cell. The non-volatile memory cell includes a semiconductor substrate; a source region in a portion of the substrate; a drain region within a portion of the substrate, the drain region being spaced apart from the source region; a well region within a portion of the substrate, the well region surrounding at least a portion of the source and drain regions; a first carrier tunneling layer over the substrate; a charge storage layer over the electron tunneling layer; a second carrier tunneling layer over the charge storage layer; and a conductive control gate over the second carrier tunneling layer.

Another example of the invention may include a non-volatile memory cell including: a semiconductor substrate; a source region formed in a portion of the substrate; a drain region formed in a portion of the substrate and adjacent to the source region; a well region formed in a portion of the substrate and adjacent to the source region and drain region; an electron tunneling layer formed over the substrate; a charge storage layer formed over the electron tunneling layer; and a p-doped polysilicon layer over the charge storage layer.

Another example of the present invention may include a method of forming a non-volatile memory cell on a semiconductor substrate. The method includes: forming a source region in a portion of the substrate; forming a drain region within a portion of the substrate, the drain region being spaced apart from the source region; forming a well region within a portion of the substrate, the well region surrounding at least a portion of the source and drain regions; forming a first carrier tunneling layer over the substrate; forming a charge storage layer over the first carrier tunneling layer; forming a second carrier tunneling layer over the charge storage layer; and forming a conductive control gate over the second carrier tunneling layer.

BRIEF DESCRIPTION OF THE SEVERAL VIEWS OF THE DRAWINGS

The following drawings illustrate examples for illustrating the invention. However, it is noted that the invention is not limited to the precise arrangements, instrumentalities, scales, and dimensions shown in these examples, which are provided mainly for illustration purposes only. In the drawings.

DETAILED DESCRIPTION OF THE INVENTION

Figure 1:
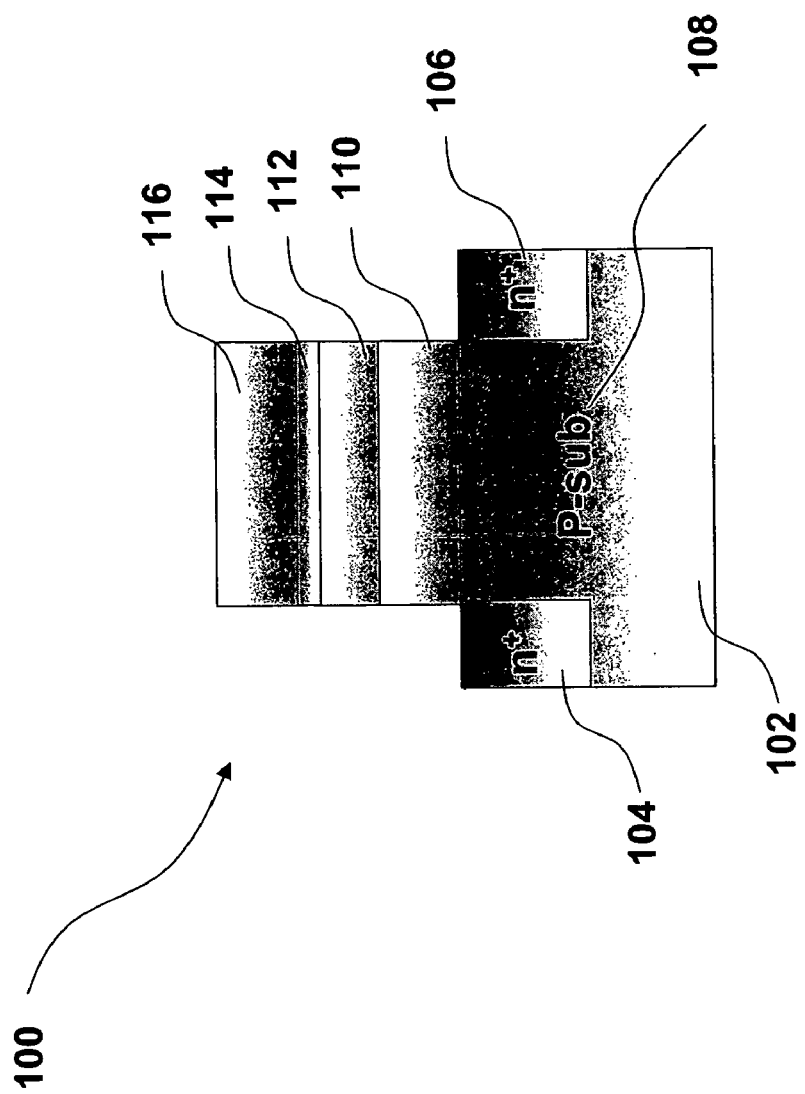
FIG. 1 illustrates an example of a non-volatile memory cell having a single-layer hole-tunneling layer consistent the invention.

The following examples of NVM devices provide improved charge retention ability or reduced charge loss, which will now be described in detail. Referring to FIG. 1, an example of a non-volatile memory (NVM) cell 100 includes semiconductor substrate 102, source region 104 in a portion of substrate 102, and drain region 106 in a portion of substrate 102. Drain region 106 is spaced apart from source region 104. NVM cell 100 also includes well region 108 in a portion of substrate 102, and well region 108 surrounds at least a portion of source region 104 and drain region 106. For example, well region 108 may encompass at least the region between source region 104 and drain region 106 and the region below those two regions.

Additionally, NVM cell 100 includes electron, or first carrier, tunneling layer 110 formed over substrate 102 and covering at least a portion of the region between source region 104 and drain region 106. A charge storage layer 112 is formed over the electron tunneling layer 110 and hole, or second carrier, tunneling layer 114 is formed over the charge storage layer 112. A conductive control gate 116 is also formed over the hole tunneling layer 114. In the example of FIG. 1, NVM cell 100 is an N-channel device, which has both source region 104 and drain region 106 as n-type or n+-type regions surrounded by well region 108, a p-type region. Electron tunneling layer 110 provides electron tunneling during a programming operation and is directly above at least a portion of the region between source and drain regions 104 and 106. Hole tunneling layer 114 includes at least one dielectric layer and provides hole tunneling during an erasing operation. In one example, a memory device may be provided without hole tunneling layer 114 and with p-doped polysilicon, i.e. polysilicon with p-type dopants, as conductive control gate 116.

Thus, a p-type substrate, such as a p-type silicon substrate, may be used as substrate 102 and may itself provide p-type well region 108. It may also be doped or implanted with an n-type material in the areas where the desired source and drain regions are to be provided. Other techniques, such as trench formation techniques, may be used to provide any of the well, source, and drain regions 108, 104, and 106, and well region 108 may also be provided by a doping/implantation process to provide a p-type well in a non p-type substrate. Furthermore, NVM cell 100 may be modified into a P-channel device by using an n-type well with p-type source and drain regions.

Referring to FIG. 1, electron tunneling layer 110 may be a dielectric layer that allows electron tunneling at least during the programming operation of NVM cell 100. For example, electron tunneling layer 120 may be a silicon oxide layer, which may be between about 30-90 Angstroms (Å) in thickness. Other than silicon oxide, aluminum oxide ($Al_2O_3$) may also be used. In some examples, a silicon oxide layer thicker than 30 Å may be used to prevent direct-tunneling charge loss from charge storage layer 112 after NVM cell 100 has been programmed (i.e., charge has been intentionally stored in charge storage layer 112). In other words, electron tunneling layer 110 also functions as an insulating layer for blocking charge loss during the charge-retention/non-programming phase of NVM cell 100.

Referring again to FIG. 1, charge storage layer 112 may be a silicon nitride layer in one example, which may be between about 50-150 Å in thickness. Other than silicon nitride ($Si_3N_4$), silicon oxynitride ($SiO_xN_x$), aluminum oxide ($Al_2O_3$), hafnium oxide ($HfO_2$), and the like may also be charge storage layer 112. In other words, any material providing appropriate charge-trapping characteristics may be charge storage layer 112 or a portion of it. In this example, charge storage layer 112 provides the programmable memory storage portion of NVM cell 100. Therefore, charge storage layer 112 may be a material that efficiently traps or stores charge after a programming operation, which may entail applying a programming voltage potential to control gate 125 and one of source region 104 and drain region 106 in order to induce or introduce charge into charge storage layer 112.

Figure 2:
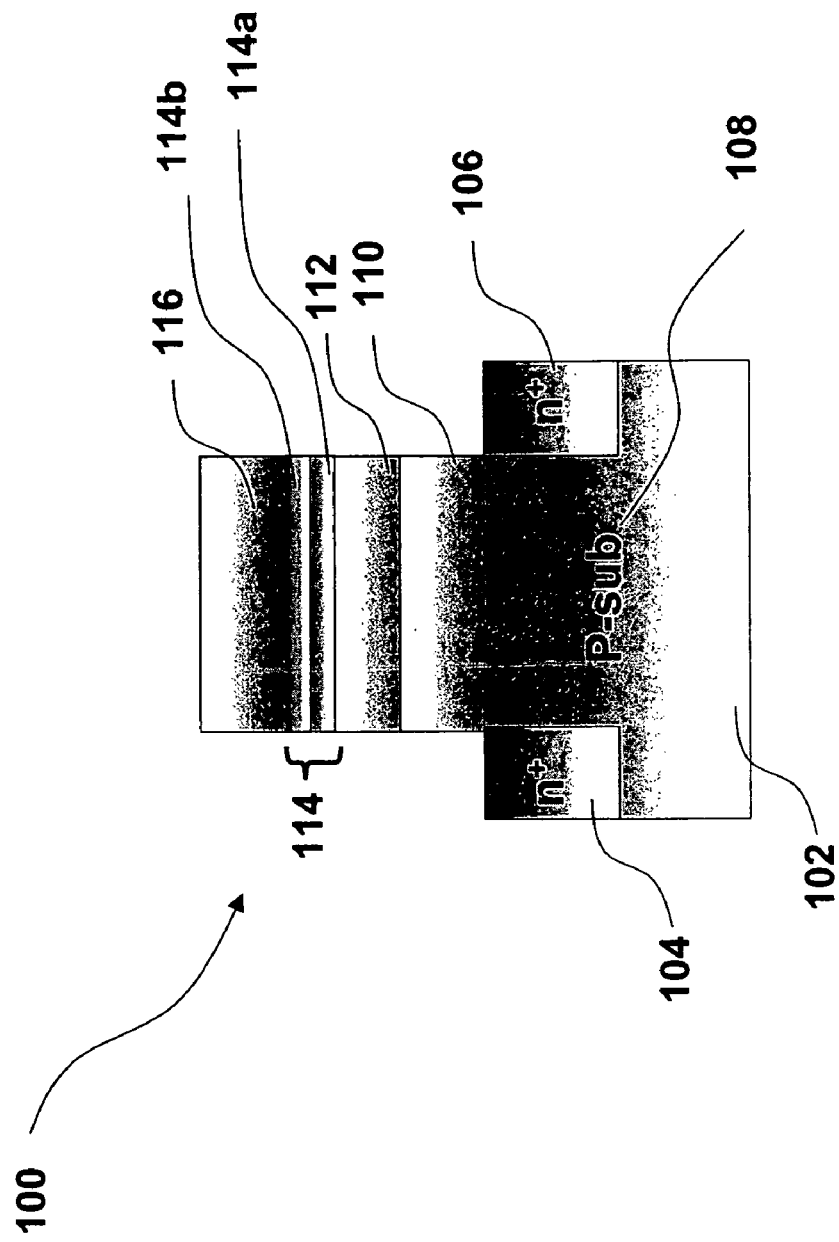
FIG. 2 illustrates an example of a non-volatile memory cell having a dual-layer hole-tunneling layer consistent the invention.
Figure 3:
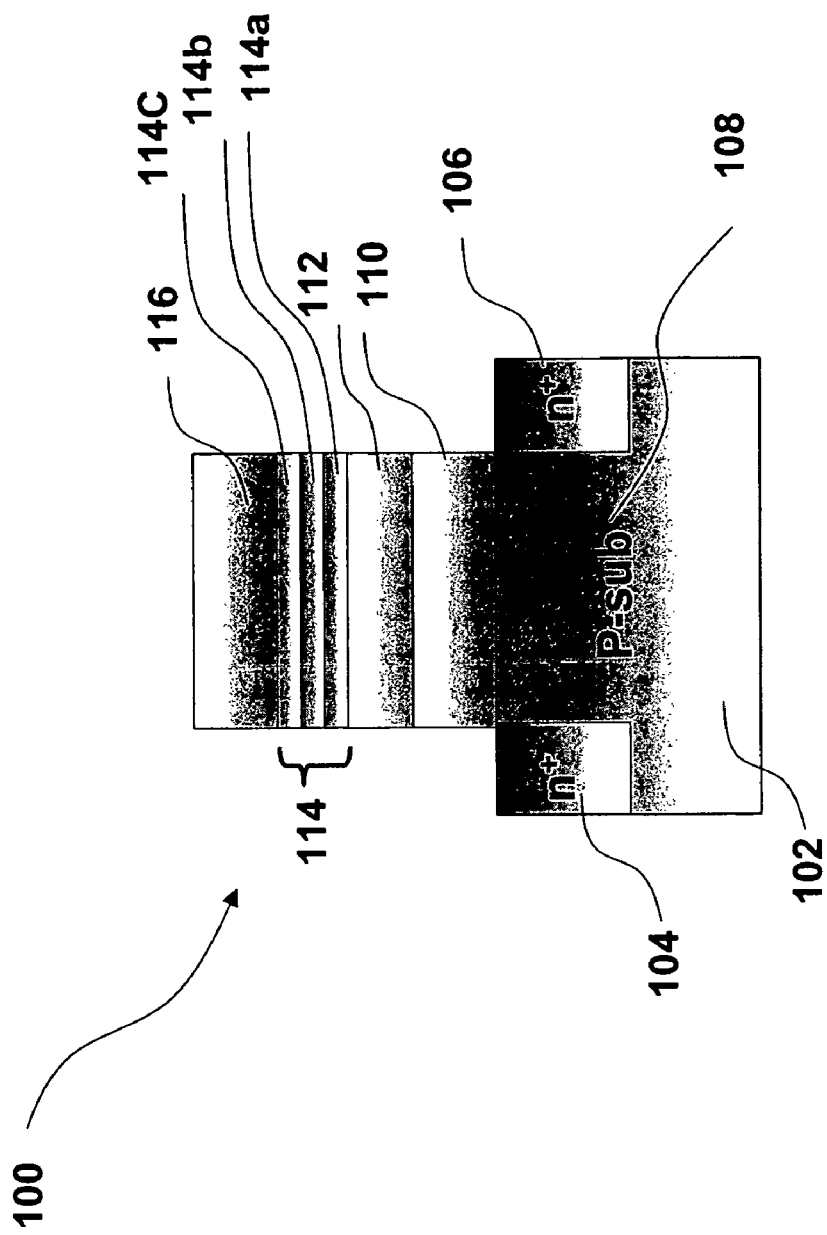
FIG. 3 illustrates an example of a non-volatile memory cell having a tri-layer hole-tunneling layer consistent the invention.

Referring to FIG. 1, hole tunneling layer 114 may contain one or more dielectric layers for providing hole tunneling at least during an erasing operation, which may include hole tunneling from conductive control gate 116 to charge storage layer 112. In the example of FIG. 1, hole tunneling layer 114 contains a single silicon oxide layer. The silicon oxide layer may be of about 15~25 Å in thickness in one example. FIG. 2 illustrates a second example of hole tunneling layer 114, which contains silicon nitride layer 114b stacked over silicon oxide layer 114a. FIG. 3 illustrates a third example of hole tunneling layer 114, which contains a stacked structure of silicon oxide layer 114c, silicon nitride layer 114b, and silicon oxide layer 114a. These examples and other examples of hole tunneling layer, such as a band-gap-engineered tunneling dielectric layer, may provide an efficient tunneling barrier for hole injection from gate 116, yet may prevent or reduce tunneling leakage, which may involve electron loss, during desired charge retention, such as during a reading operation, a programming operation, or both. In some examples, each of the dielectric layers of hole tunneling layer 114 may be between about 10-30 Å in thickness. As an example, a trilayer structure such as the one shown in FIG. 3 may have silicon oxide layer 114c of about 15~25 Å in thickness, silicon nitride layer 114b of about 30~60 Å in thickness, and silicon oxide layer 114a of about 15~25 Å in thickness.

In some examples, hole tunneling layer 114 may contain at least silicon nitride or other insulating or dielectric materials with a low hole-barrier height, such as one of less than about 3 electron-volts (eV). As an example, silicon nitride is a relatively low hole barrier, which is on the order of 1.9 eV, so it may become "transparent" to hole tunneling under a relatively high electric field, such as when voltage applied to control gate 116 is greater than zero. The design of hole tunneling layer 114 may have it function as a tunneling dielectric for hole tunneling from control gate 116 during an erasing operation. A thin hole tunneling layer 114 may make the charge-trapping in the layer itself negligible during memory programming and charge-retention operations.

Conductive control gate 116 may be formed of undoped polysilicon, doped polysilicon, or a metal. For example, control gate 116 may be lightly or heavily n-doped polysilicon, lightly or heavily p-doped polysilicon, platinum (Pt), Tantalum Nitride (TaN) and the like. In some examples, a p-doped polysilicon may facilitates hole tunneling and provide good erasing characteristics. As illustrated above in one example, a memory device may be provided without hole tunneling layer 114 and with p-doped polysilicon as conductive control gate 116.

Figure 4:
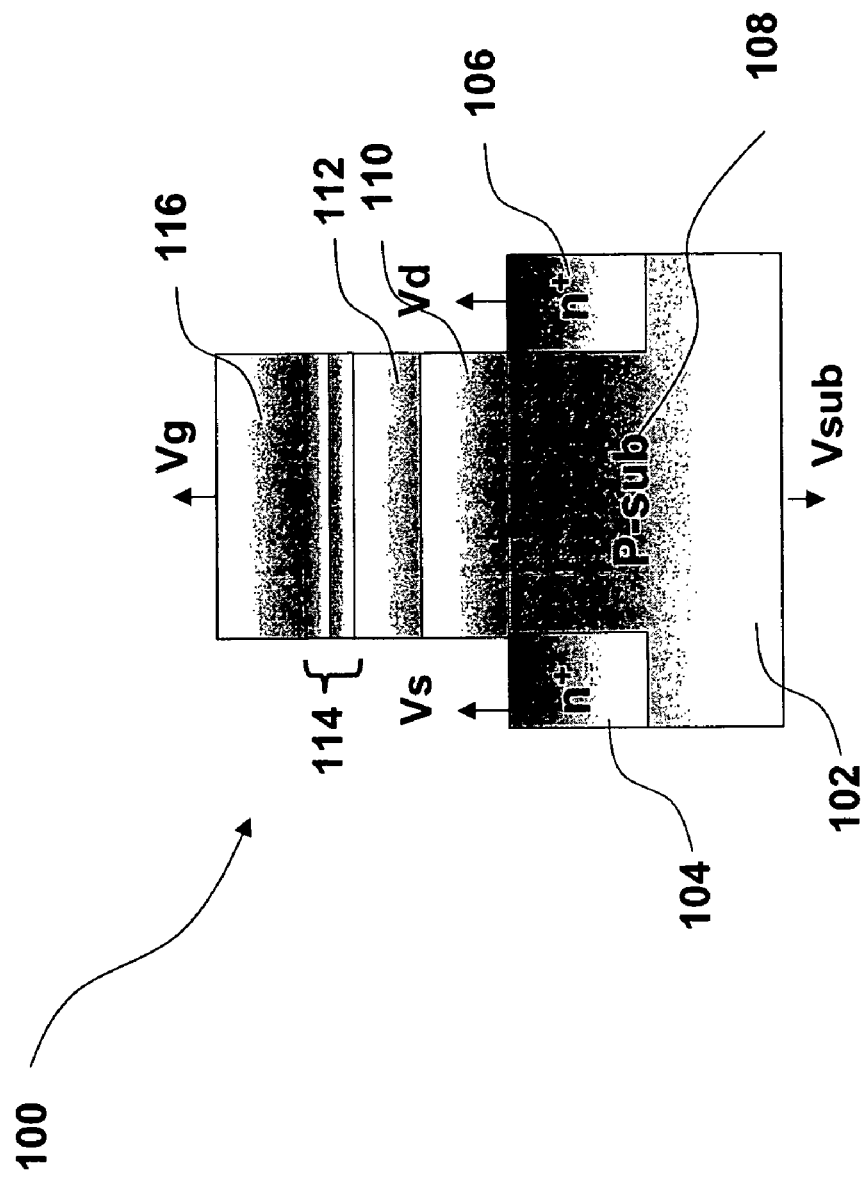
FIG. 4 illustrates an example of signal designations for separate terminals of a non-volatile memory consistent the invention.

The paragraphs below illustrate an example of operating NVM cell 100 using an exemplary structure of NVM cell 100, such as the one illustrated in FIG. 2. The operation of NVM cell 100 may include programming information in to the cell, reading information already stored in the cell, and erasing information stored in the cell before writing or programming new information. Those operations may be achieved by applying appropriate voltages to separate terminals of NVM cell 100. FIG. 4 illustrates an example of signal designations. Referring to FIG. 4, gate voltage $V_g$ is applied to control gate 116, source voltage $V_s$ is applied to source 104, drain voltage $V_d$ is applied to drain 106, and substrate voltage $V_{sub}$ is applied to substrate 102.

Figures 5, 6:
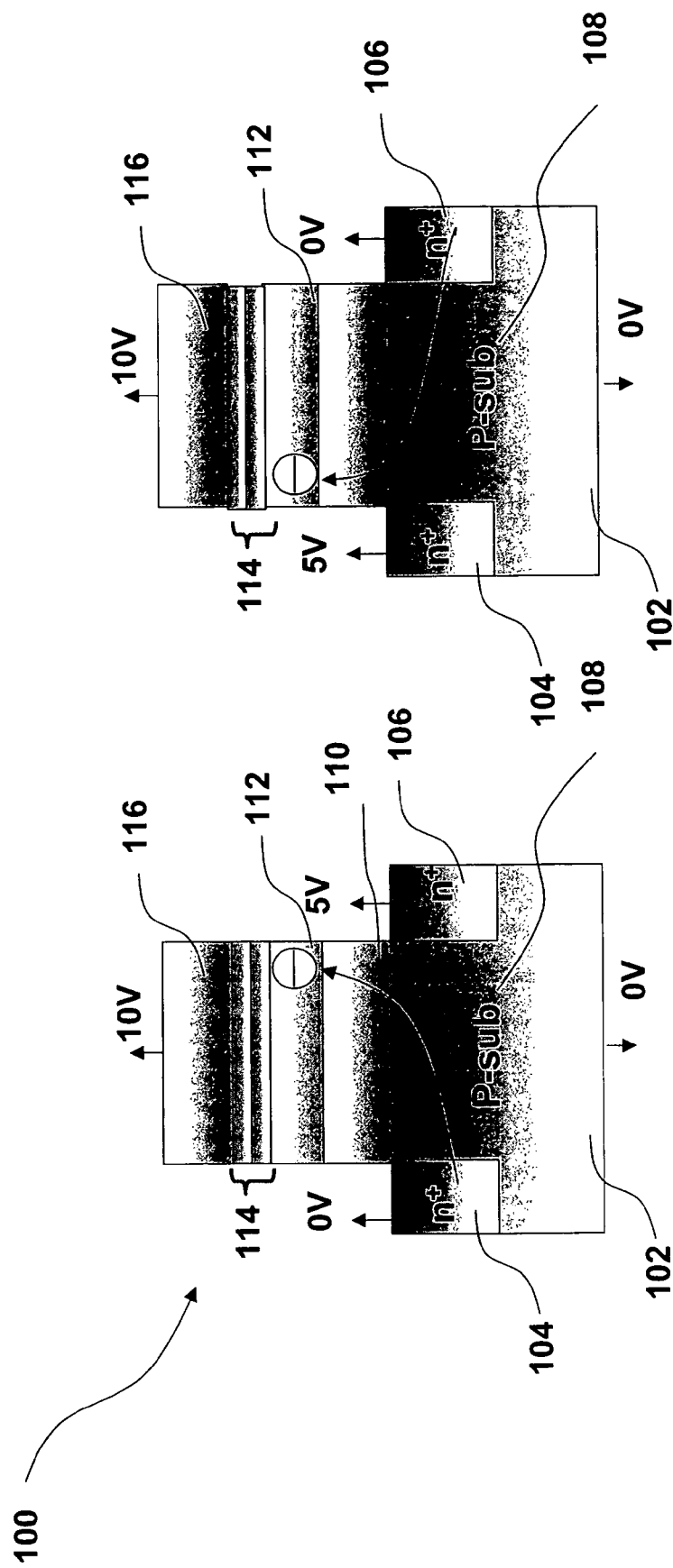
FIGS. 5 and 6 illustrate one example of a programming operation of a non-volatile memory consistent the invention.

FIGS. 5 and 6 illustrate one example of a programming operation. In the illustrated example, NVM cell 100 is programmed by an electron injection method, such as a channel hot electron (CHE) injection. However, more than one programming methods may also be used. For n-channel devices, channel hot electron (CHE) injection, source side injection (SSI), channel initiated secondary electron (CHISEL) injection, and the like, can be employed. For p-channel device, band-to-band tunneling hot electron (BBHE) injection, channel hot-hole initiated hot electron injection, negative Fowler-Nordheim (−FN) gate injected electrons, or the like can be employed. By having at least a pair of source and drain regions, NVM cell 100 can be programmed with 2-bits per cell with a first (left) bit in charge storage layer 112 closer to source region 104 and a second (right) bit in charge storage layer 112 closer to drain region 106.

Referring to FIG. 5, a right bit or drain-side bit programming operation using CHE injection may entail applying a gate programming voltage $V_g$, such as a voltage of +10 volts, to control gate 116, a programming source voltage $V_s$ of zero, and a programming drain voltage $V_d$ of +5 volts. The substrate voltage $V_{sub}$ may be zero. Referring to FIG. 6, similarly, a left bit or source-side bit programming operation using CHE injection may entail applying a gate programming voltage $V_g$, such as a voltage of +10 volts, to control gate 116, a programming source voltage $V_s$ of +5 volts, and a programming drain voltage $V_d$ of zero. The substrate voltage $V_{sub}$ may be zero. FIGS. 5 and 6 are merely illustrative of one possible example, and different voltage combination may be used to place electrons in charge storage layer 112 in order to store information therein.

NVM cell 100 may be read by several reading methods. For example, it can be read by applying a gate read voltage to control gate 112 and a source/drain read voltage to one of source region and drain regions 104 and 106 and grounding the other one. The substrate voltage $V_{sub}$ may be zero. As an example, the gate read voltage and the source/drain read voltage may each be between about 1-2 volts.

Figure 7:
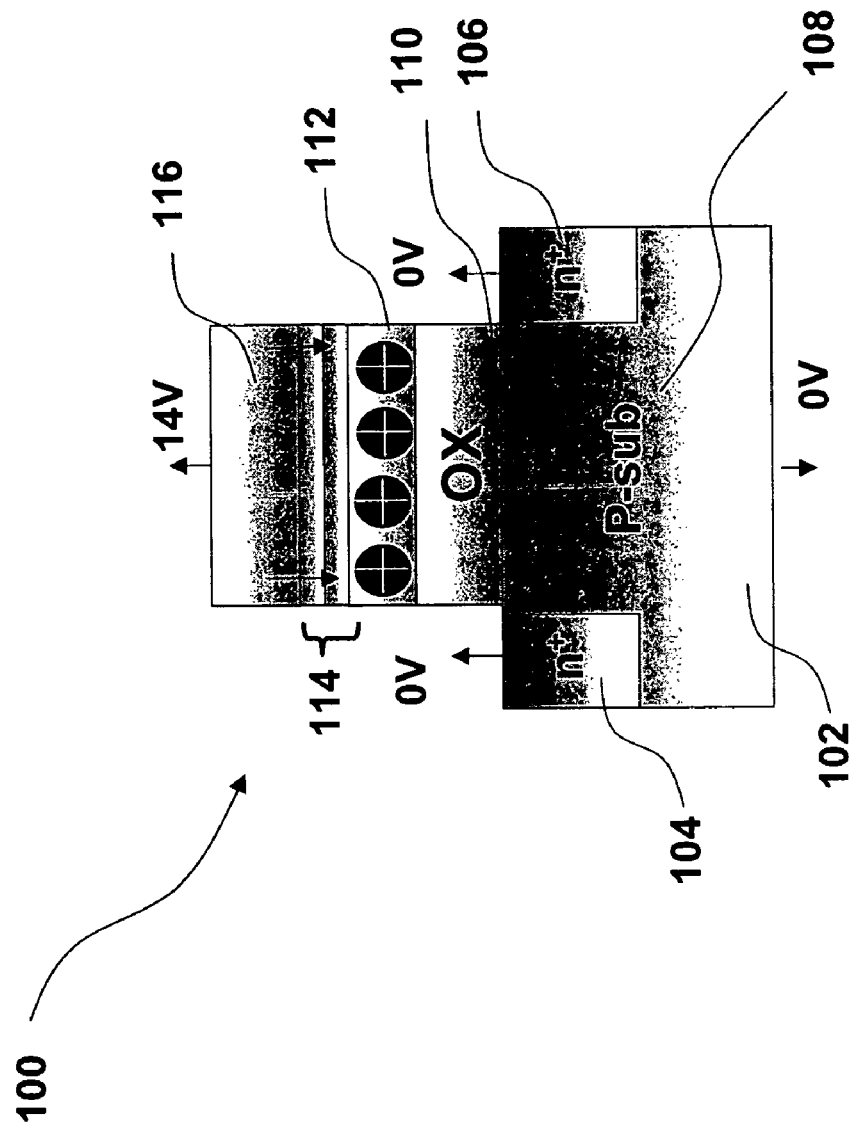
FIG. 7 illustrates one example of an erasing operation of a non-volatile memory consistent the invention.

FIG. 7 illustrates one example of an erasing operation. Referring to FIG. 7, an erasing operation may entail applying a gate erasing voltage $V_g$, such as a voltage of +14 volts, to control gate 116 and a source/drain erasing voltage $V_{s/d}$, such as a voltage of 0 volts, to one or both of source region 104 and drain region 106. The substrate voltage $V_{sub}$ may be zero. A voltage difference such as this exemplary one may induce charge into charge storage layer 112. As an example, a positive direct current voltage at control gate 116 may provide hole tunneling from control gate 116 toward charge storage layer 112. In some examples, a gate erasing voltage $V_g$ is about +10 to about +18 volts. Additionally, a zero or negative source/drain erasing voltage may be applied to one or both of source region 104 and drain region 106. As an example, using hole-tunneling erase from the gate avoid the need to utilize band-to-band hot hole erase (BTBHHE), thereby reducing or eliminating hot-hole introduced damage.

Figure 8B:
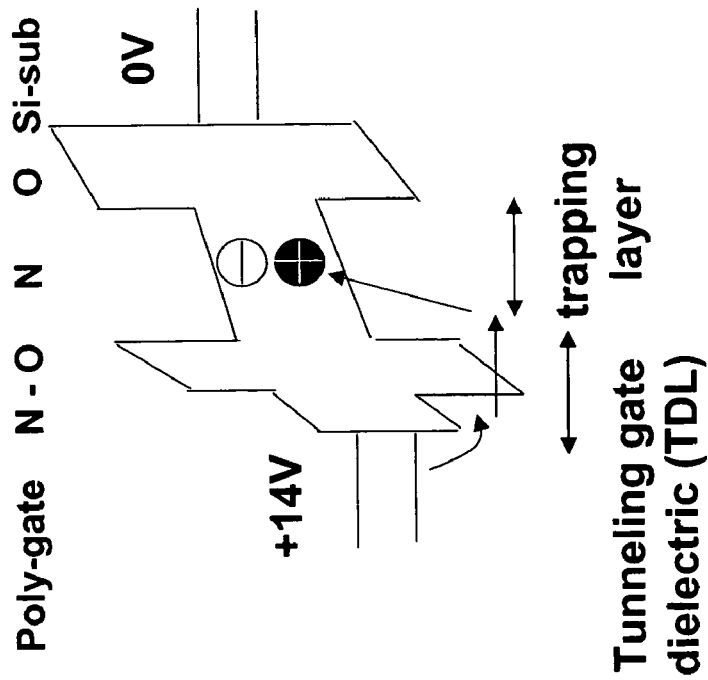
FIG. 8B is a band energy diagram of a non-volatile memory consistent with the invention when the electric field is high.
Figure 8A:
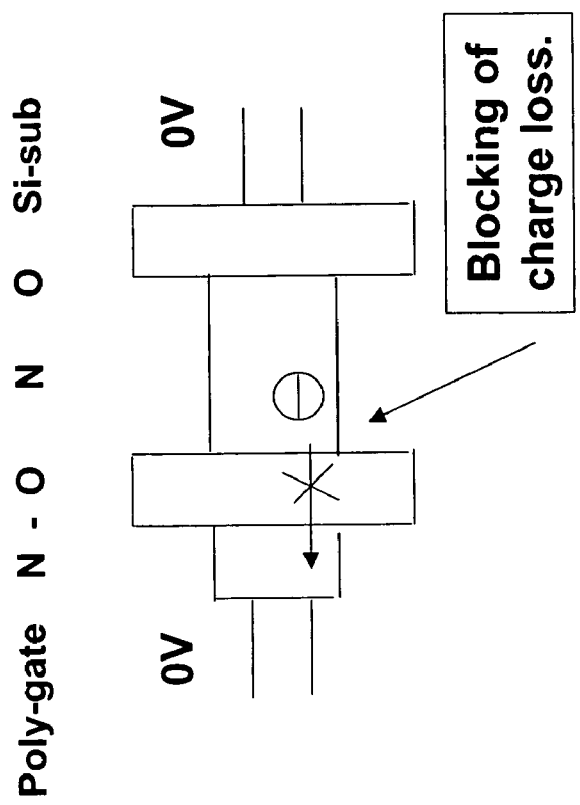
FIG. 8A is a band energy diagram of a non-volatile memory consistent with the invention when the electric field is low.

FIG. 8A is a band energy diagram of hole tunneling layer 114, such as a silicon-nitride-silicon-oxide region designated as N—O in the figure. When the electric field is low, such as during a charge retention state ($V_g \approx 0$) or a reading state ($V_g \approx +1-+2$ volts) in some examples, band offset of hole tunneling layer 114 does not occur. Accordingly, tunneling through hole tunneling layer 114 is suppressed, which prevents charge loss from charge storage layer 112, such as a silicon nitride region designed as the second "N" from the left in FIG. 8A. FIG. 8B is a band energy diagram of hole tunneling layer 114, such as a silicon-nitride-silicon-oxide region designated as N—O in the figure. When voltage $V_g$ applied to control gate 116 is non-zero, such as 14 volts, there is a relatively high electric field. Under the high electric field, band offset of hole tunneling layer 114 occurs, thereby providing hole tunneling from control gate 116 to charge storage layer 112, such as silicon a nitride trapping region designed as the second "N" from the left in FIG. 8B.

The present invention also includes methods of forming NVM cells on a semiconductor substrate. Taking the cell illustrated in FIGS. 1-3 as an example, the method includes forming source region 104 in a portion of substrate 102; forming drain region 106 within a portion of substrate 102, drain region 106 being spaced apart from source region 104; forming well region 108 within a portion of substrate 102, the well region surrounding at least a portion of source and drain regions 104 and 106. In some examples, source, drain, and well regions each is a doped regions and may be formed by doping, implantation, or diffusion techniques or a combination of them.

The method further includes forming electron tunneling layer 112 over substrate 102; forming charge storage layer 112 over electron tunneling layer 110; forming hole tunneling layer 114 over charge storage layer 112; and forming conductive control gate 116 over hole tunneling layer 114 These layers may be formed by deposition techniques. Additionally, for materials such as silicon nitride or silicon oxide, deposition or a combination of silicon deposition and nitridation or oxidation may be used. And the shape, dimension, and location of each of these layers may be defined by one or more lithography process, which may use a mask to define active regions and apply an etch process to remove regions not needed.

In this example, electron tunneling layer 110 may provide electron tunneling during a programming operation and may be directly over at least a portion of a region between source and drain regions 104 and 106. Hole tunneling layer 114 may include at least one dielectric layer and may provide hole tunneling during an erasing operation. As noted above, hole tunneling layer 114 may also serve as an electron block layer during at least one of a reading operation and a programming operation. For the layers formed here, the corresponding configuration, location, and materials illustrated above for FIGS. 1-3 may be used, and similar thicknesses may be used in some examples. Additionally, a device formed by the illustrated method may be operated in the ways noted above for the programming, reading, and erasing operations.

In some examples, an NVM cell may be applied to various memory types including NOR and NAND memories. NVM cells 100 may also be used in a virtual ground array architecture. Additionally, hole tunneling layer 114 may include additional layers of silicon oxide, silicon nitride, or other materials.

From the foregoing, examples of the present invention are directed to a non-volatile memory semiconductor device having a hole tunneling layer and a method for manufacturing a non-volatile memory semiconductor device having a hole tunneling layer. It will be appreciated by those skilled in the art that changes could be made to the embodiments described above without departing from the broad inventive concept thereof. It is understood, therefore, that this invention is not limited to the particular examples disclosed, but it is intended to cover modifications within the spirit and scope of the present invention as defined by the appended claims.

We claim:

1. A non-volatile memory cell comprising:
   a semiconductor substrate;
   an electron tunneling layer formed over the substrate;
   a charge storage layer formed over the electron tunneling layer;
   a hole tunneling layer formed over the charge storage layer, the hole tunneling layer comprising a multi-layer structure adapted for hole tunneling; and a conductive control gate over the hole tunneling layer; and circuitry to induce electron tunneling through the electron tunneling layer in a program mode to increase negative charge trapped in the charge storage layer, and to induce hole tunneling through the hole tunneling layer in an erase mode to reduce negative charge trapped in the charge storage layer.

2. The non-volatile memory cell of claim 1, wherein the hole tunneling layer provides electron blocking effects during at least one of a reading operation and a programming operation of the non-volatile memory cell.

3. The non-volatile memory cell of claim 1, wherein the hole tunneling layer includes a nitride layer and an oxide layer, and the oxide layer is between 10 Å and 30 Å in thickness.

4. The non-volatile memory cell of claim 1, wherein the hole tunneling layer includes a nitride layer and an oxide layer, and the oxide layer is about 15-25 Å in thickness.

5. The non-volatile memory cell of claim 1, wherein the charge storage layer comprises at least one of silicon nitride, silicon oxynitride, aluminum oxide, and hafnium oxide.

6. The non-volatile memory cell of claim 1, wherein the control gate comprises p-doped polysilicon.

7. The non-volatile memory cell of claim 1, wherein the circuitry to induce electron tunneling through the electron tunneling layer biases the cell during the program mode to cause hot electron injection from the substrate.

8. The non-volatile memory cell of claim 1, the memory cell including a source region, a channel region and a drain region, wherein the charge storage layer stores at least two separately readable charge storage sites including a first charge storage site proximate the source region and a second charge storage site proximate the drain region, and the circuitry to induce electron tunneling through the electron tunneling layer is operable to induce hot electron injection to the first and second charge storage sites.

9. The non-volatile memory cell of claim 1, wherein the hole tunneling layer includes a nitride layer and an oxide layer, and the nitride layer is between 30 Å and 60 Å in thickness.

10. A non-volatile memory cell comprising:

a semiconductor substrate;

a channel region in a portion of the substrate;

an electron tunneling layer formed over the channel region in the substrate;

a charge storage layer formed over the electron tunneling layer;

a hole tunneling layer deposed over the charge storage layer, wherein the hole tunneling layer includes multiple layers, said multiple layers including at least a nitride layer;

a conductive control gate in contact with the nitride layer; and circuitry to induce electron tunneling through the electron tunneling layer in a program mode to increase negative charge trapped in the charge storage layer, and to induce hole tunneling through the hole tunneling layer in an erase mode to reduce negative charge trapped in the charge storage layer.

11. The non-volatile memory cell of claim 10, wherein the hole tunneling layer provides electron blocking effects during at least one of a reading operation and a programming operation of the non-volatile memory cell.

12. The non-volatile memory cell of claim 10, wherein the charge storage layer comprises at least one of silicon nitride, silicon oxynitride, aluminum oxide, and hafnium oxide.

13. The non-volatile memory cell of claim 10, wherein the control gate comprises a p-doped polysilicon.

14. The non-volatile memory cell of claim 10, wherein the nitride layer is about 30~60 Å in thickness.

15. The non-volatile memory cell of claim 11, wherein said multiple layers of the hole tunneling layer include an oxide layer.

16. The non-volatile memory cell of claim 15, wherein the nitride layer is between 10 Å and 30 Å in thickness, and the oxide layer is between 10 Å and 30 Å in thickness.

17. The non-volatile memory cell of claim 15, wherein the oxide layer is about 15-25 Å in thickness.

18. The non-volatile memory cell of claim 15, wherein the oxide layer is about 15-25 Å in thickness.

* * * * *